United States Patent [19]

Naden et al.

[11] 4,017,604
[45] Apr. 12, 1977

[54] MAGNETIC BUBBLE CHIP PACKAGING ASSEMBLY

[75] Inventors: Rex Alan Naden; Terry Wayne Noe, both of Richardson, Tex.

[73] Assignee: Texas Instruments Incorporated, Dallas, Tex.

[22] Filed: Mar. 3, 1975

[21] Appl. No.: 554,955

[52] U.S. Cl. ..................... 340/174 TF; 340/174 S
[51] Int. Cl.² ..................................... G11C 11/14
[58] Field of Search ............... 340/174 TF, 174 SR, 340/174 MA

[56] References Cited

UNITED STATES PATENTS

| | | | |
|---|---|---|---|
| 3,702,991 | 11/1972 | Bate et al. | 340/174 TF |
| 3,742,471 | 6/1973 | Mikami | 340/174 S |
| 3,848,209 | 11/1974 | Lee et al. | 340/174 TF |

OTHER PUBLICATIONS

AIP Conference Proceedings– No. 5; Pt 1, 1971 pp. 225–229.
IBM Technical Disclosure Bulletin – vol. 16, No. 7, Dec. 1973 pp. 2129–2130.

Primary Examiner—James W. Moffitt
Attorney, Agent, or Firm—Harold Levine; James T. Comfort; William E. Hiller

[57] ABSTRACT

A packaging assembly for magnetic bubble chips comprising at least one module assembly board having a surface to which is secured in a substantially planar array a plurality of magnetic bubble chips for the storing and processing of information. First and second sets of terminals are located on opposed lateral edges of the module assembly board for the routing therethrough of information to and from the chips. First and second mounting boards are provided, each board having a set of receptacles for the soldering thereto of a corresponding set of the terminals. A first coil surrounds the module assembly board and is wound about an axis parallel to that of the plane of the chips for producing a magnetic field parallel thereto. A second coil surrounds the first coil and is wound about an axis perpendicular to that of the first coil and parallel to that of the plane of the chips for producing a magnetic field parallel thereto. A bias field source is positioned exterior to the second coil to produce a substantially constant magnetic field perpendicular to the plane of the chips. The first and second coils are excited to produce a rotating magnetic field parallel to the plane of the chips to control the movement of magnetic bubbles therein. Control components for the storage and processing of information in the chips are also provided. Convenient access to the chips may be gained by the sequential disassembly of the bias field source, the second coil, reheating the solder connection between the terminals and receptacles, and the first coil.

11 Claims, 6 Drawing Figures

FIG. 1
FIG. 6
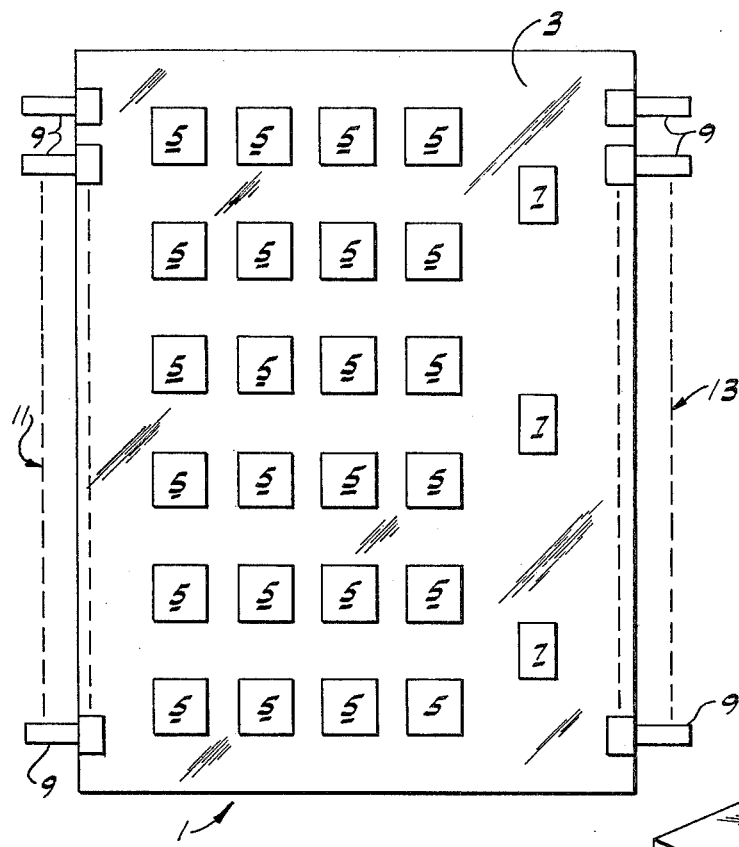
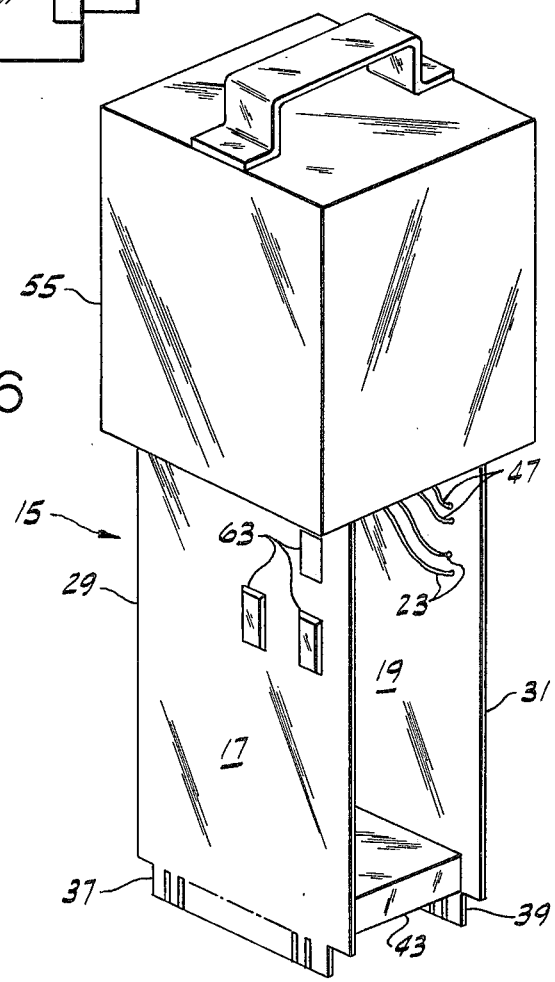

FIG. 4
FIG. 5
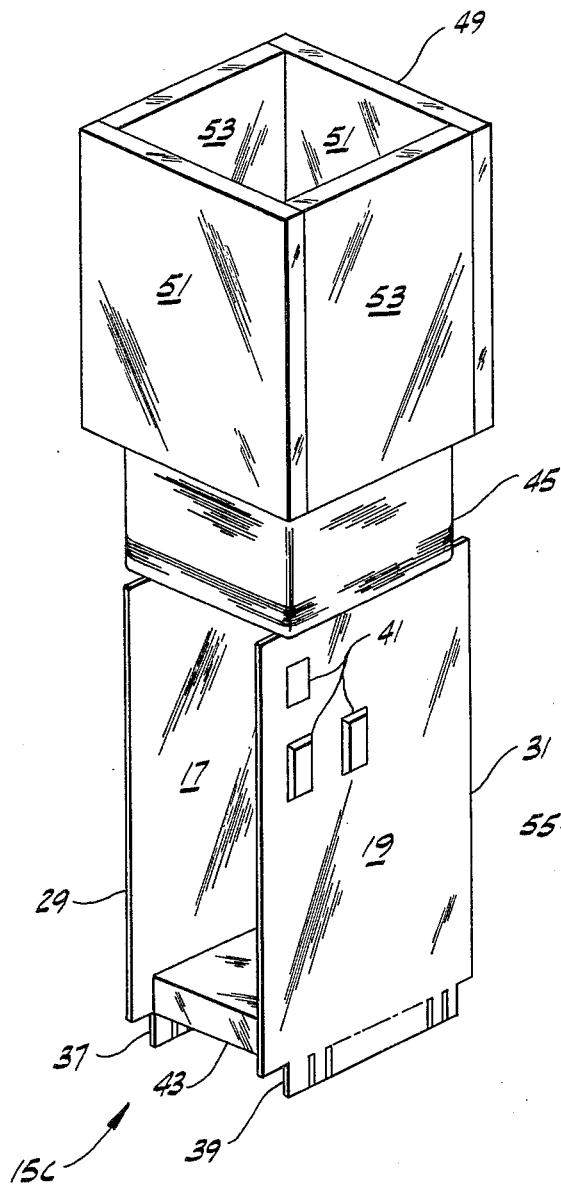
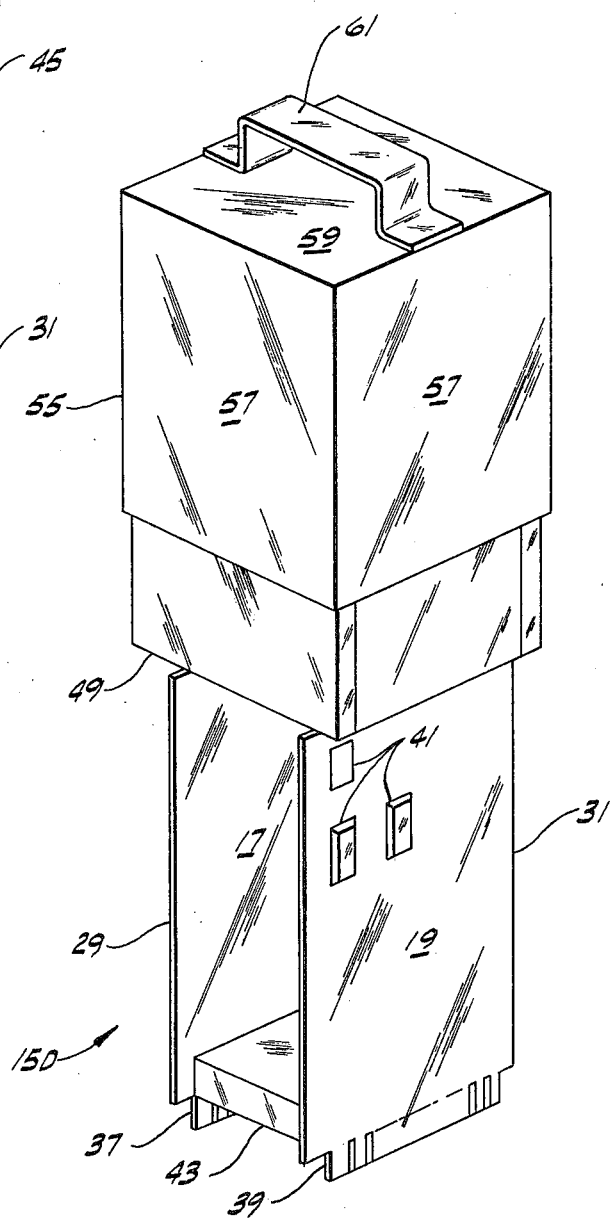

MAGNETIC BUBBLE CHIP PACKAGING ASSEMBLY

BACKGROUND OF THE INVENTION

This invention relates to packaging techniques for magnetic bubble chips, and more particularly to a method for packaging a large quantity of such chips.

Magnetic bubble devices have been of growing interest because of the ability to store more bits of information in less space than now required by conventional methods such as ferrite cores and to process the stored information in a less complicated manner than is presently possible. Magnetic bubble memories have been developed in which very large numbers of bit information can be stored in very small areas. Further, techniques are being developed by which bits stored in magnetic bubble chips can be processed on the same or other magnetic bubble chips with various logic and switching functions being performed with less power being required than with conventional computer circuitry and with great reliability.

Some drawbacks to implementing magnetic bubble chips and devices into system designs are the need to package a sufficiently large number of magnetic bubble chips cheaply and the ability to gain access to the chips quickly and conveniently. Unlike conventional electronic circuits, magnetic bubble devices require a specific magnetic environment in order to operate properly. Two magnetic fields are required to create this environment. The first field is a constant magnetic field perpendicular to the surface of a magnetic bubble chip and is used to maintain magnetic bubble domains in the chip in their proper physical diameters. The second field is a rotating field parallel to the surface of a chip. As this field rotates, it interacts with magnetizable elements on the surface of the chip, thus creating time-varying magnetic field gradients, which control the movement of the magnetic bubble domains in the chip. Thus, any design utilizing magnetic bubble devices necessarily has to provide the proper magnetic environment for each chip.

Further, provisions are necessary to easily interface an assembled body of chips with conventional electronic circuits.

SUMMARY OF THE INVENTION

Among the several objects of the invention may be noted the provision of a packaging assembly for a plurality of magnetic bubble chips; the provision of such an assembly which is easily assembled and disassembled; the provision of such an assembly in which electronic components are of a type and are positioned for ease of interfacing chips and other circuits and in which noise interference between drive and control lines is reduced; the provision of such an assembly in which a predetermined magnetic environment is maintained for all chips; and the provision of such an assembly which has low power requirements, good heat dissipation characteristics, is economical in construction and is reliable in operation.

Briefly, a packaging assembly for magnetic bubble chips of this invention comprises at least one module assembly board having a surface to which is secured in a substantially planar array a plurality of magnetic bubble chips for the storing and processing of information. First and second sets of terminals are located on opposed lateral edges of the module assembly board for the routing therethrough of information to and from the chips. First and second mounting boards are provided, each board having a set of receptacle means for the soldering thereto of a corresponding set of these terminals. A first coil surrounds the module assembly board and is wound about an axis parallel to that of the plane of the chips for producing a magnetic field parallel thereto. A second coil surrounds the first coil and is wound about an axis perpendicular to that of the first coil and parallel to that of the plane of the chips for producing a magnetic field parallel thereto. Bias field means positioned exterior to the second coil produce a substantially constant magnetic field perpendicular to the plane of the chips. Means are provided for exciting the first and second coils to produce a rotating magnetic field parallel to the plane of the chips to control the movement of magnetic bubbles therein. Further means are provided for controlling the storage and processing of information in the chips. Convenient access to the chips may be gained by the sequential disassembly of the bias field means, the second coil, reheating the solder connection between the terminals and receptacle means, and the first coil. Other objects and features will be in part apparent and in part pointed out hereinafter.

BRIEF DESCRIPTION OF THE DRAWINGS

FIG. 1 illustrates a module assembly board of a packaging assembly of the present invention;

FIGS. 2–5 are trimetric views illustrating partial assemblies of the package of the present invention; and FIG. 6 illustrates a completed packaging assembly.

Corresponding reference characters indicate corresponding parts throughout the several views of the drawings.

DESCRIPTION OF A PREFERRED EMBODIMENT

Figures 2, 3:
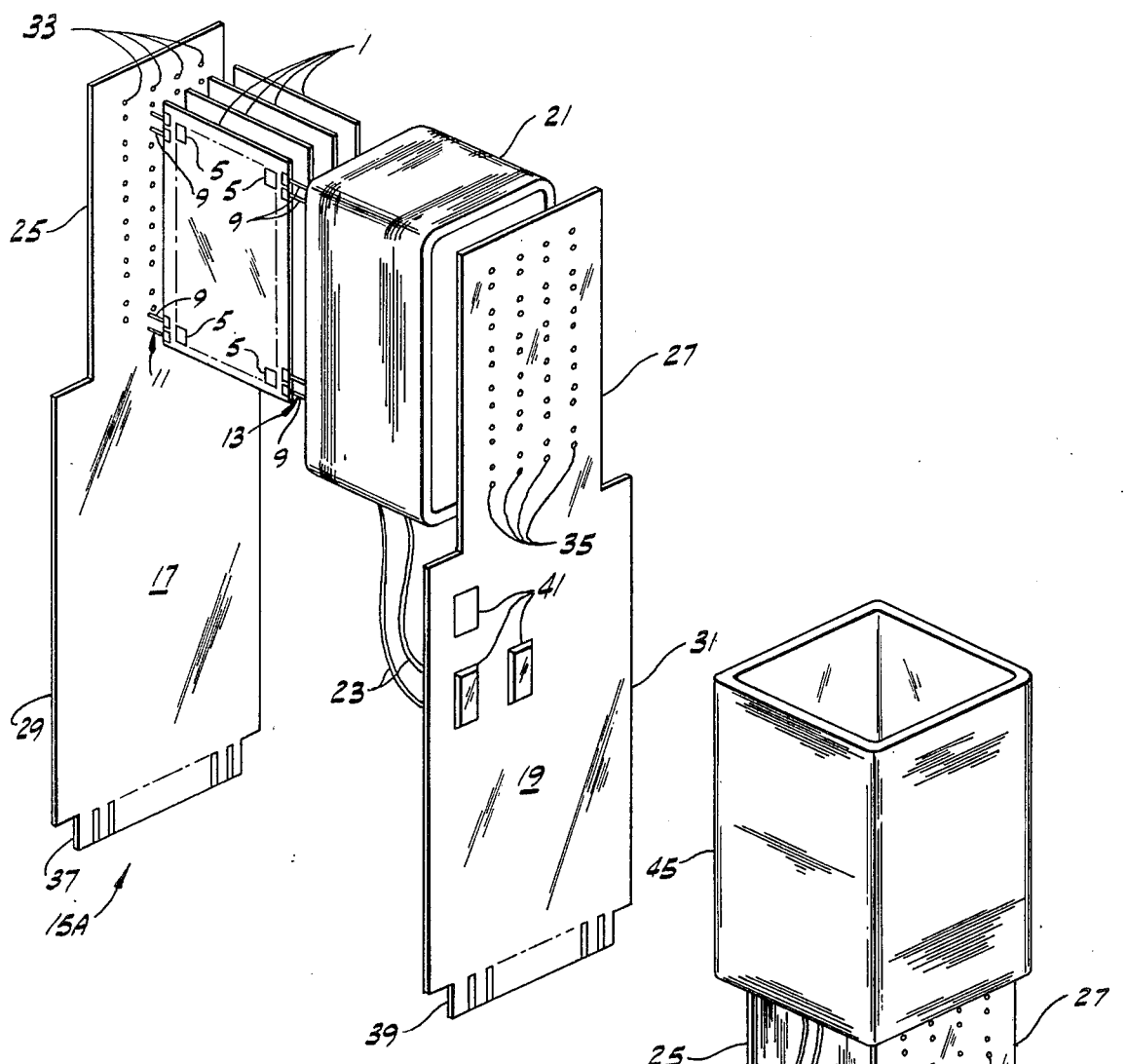

Referring now to the drawings, and more particularly to FIG. 1, a module assembly board of the present invention is generally indicated at 1. Board 1 is, for example, constructed of an alumina substrate material 3. Attached to one surface of board 1 are a plurality of magnetic bubble chips 5 and a plurality of electronic integrated circuit chips 7. For illustrative purposes 24 chips 5 and three chips 7 are shown in FIG. 1. On opposed lateral edges of board 1 there are attached first and second sets, 11 and 13, of terminals constituted by a plurality of connector pins 9. Terminal sets 11 and 13 are required for interfacing board 1 with other circuits.

The magnetic bubble chips 5, which are used for storing and processing information, and the integrated circuit chips 7, which are used to control operations performed on the chips 5, are secured to a surface of board 1 by using a face-down bonding technique which permits easy chip removal if replacement of board 1 for rework is necessary. When secured to an assembly board 1 surface the plurality of attached chips 5 constitute a substantially planar array. Connector pins 9 are initially prearranged on a carrier strip which is laid along the appropriate edge of board 1 so that the pins 9 extend outwardly from board 1 as shown. The pins are then brazed to the substrate material 3, after which the carrier strip is removed.

Referring now to FIG. 2, portions of a packaging assembly 15 of the present invention are shown in an initial stage of assembly 15A as including a plurality of module assembly boards 1 having opposed lateral terminal sets 11 and 13, first and second printed wiring boards 17 and 19, and a first magnetic coil 21 having power leads 23. Each printed wiring board 17 and 19 has a relatively narrow first section, 25 and 27 respectively, and a second broader section, 29 and 31 respectively. On sections 25 and 27, of boards 17 and 19, are mounted sets, 33 and 35 respectively, of terminal receptacles into which pins 9 of corresponding terminal sets, 11 and 13, of each module assembly board 1 may be introduced. At the base of each module assembly board there are etched tab connectors, 37 and 39 respectively, for interfacing a completed package assembly 15 with other circuits. Mounted on the broad section 31 of board 19 are a plurality of discrete electronic devices and of dual-in-line integrated circuit packages (DIP's) generally indicated at 41, whose function will be discussed hereinafter. Another group of discretes and DIP's (not shown), whose function will similarly be discussed hereinafter, is mounted on the broad section 29 of board 17. Coil 21 is a flat-wound coil which may be constituted by printing wiring on a flexible substrate material or laminated coils, and whose winding axis, after installation, is parallel to that of the planar array of chips 5 on each module assembly board 1. Coil 21, when excited, produces a magnetic field parallel to that of the planar arrays of chips 5.

For making the partial assembly 15A shown in FIG. 2, the terminal sets 11 of the module boards 1 are plugged into the corresponding terminal receptacle sets 33 on section 25 of board 17 and the resulting connections are wave soldered. For increased structural rigidity and vibration protection of the final assembly, a filler material (not shown) may next be inserted between each board 1. Coil 21 is then slid over the module assembly boards 1 and the terminal sets 13 of the boards 1 are plugged into the corresponding terminal receptacle sets 35 on section 27 of board 19. These resulting connections are also wave soldered. Current leads 23 of coil 21 are attached to the broad section 31 of board 19 to connect with output leads of the DIP's 41. It is to be noted that the receptacle sets 33 and 35 to which the terminal sets 11 and 13 are soldered are so mounted on boards 17 and 19 that after installation the planar arrays of chips 5 on the module assembly boards 1 and printed wiring boards 17 and 19 are parallel to and generally in registry with each other. This feature insures that each chip 5 on each board 1 is subjected to the same magnetic environment.

Referring now to FIG. 3, the next stages of package assembly are shown at 15B. A spacer 43, whose function is to provide structural rigidity is installed between the bases of boards 17 and 19. A second coil 45, having power leads 47, is slid over the prior assembled components so as to encompass or encircle the first coil so that coil 21 nests in coil 45. Coil 45, like coil 21, is flat wound and similarly constituted, and when installed has a winding axis perpendicular to that of coil 21 and parallel to that of the planar arrays of chips 5 on the module assembly boards 1. Like coil 21, coil 45, when energized, produces a magnetic field parallel to the planar arrays of chips. Current leads 47 are attached to the broad section 31 of board 19 so as to connect with output leads of the DIP's 41.

The next stage of assembly 15C, shown in FIG. 4, is the installation of a permanent magnetic assembly 49. Assembly 49 comprises two opposed planar permanent magnets 53 and two opposed "soft" magnetic plates 51 for supporting magnets 53 in parallel registering relationship with each other. As shown, assembly 49 is slid over the prior subassembly and surrounds the second coil 45. Once installed, the permanent magnets 53 in conjunction with the plates 51 produce a constant magnetic field of the desired strength perpendicular to the planar arrays of chips 5 on the module assembly boards 1. This constant magnetic field will keep magnetic bubbles on all the chips 5 on all module assembly boards 1 in a non-volatile state; that is, each magnetic bubble domain in each chip 5 will maintain the same physical dimensions.

FIG. 5 shows the final assembly step wherein a cover 55, having sides 57, a top 59, and a handle 61 is placed over the permanent magnet assembly 49. Cover 55 is constructed of a shielding material which will shunt stray magnetic fields allowing the magnetic environment surrounding the chips 5 to be constantly maintained. The handle 61 permits ease of handling of a completed package 15 and facilitates the storage or installation and removal of a package 15 into or from a larger assembly.

A completed package assembly 15 is shown in FIG. 6. Also shown are discrete electronic devices and DIP's, generally at 63, mounted on the broad section 29 of board 17. The electronic circuits contained in these packages, together with the circuits in the chips 7 on the module assembly boards 1, control the storing and processing operations performed on the chips 5. Control and data signals to and from the electronic components 63 are routed through the terminal set 11, receptacle 33 soldered connections, and control and data signals to and from other circuits are routed to and from packaging assembly 15 through tab connector 37.

The electronic components shown generally at 41 in FIG. 2, serve two purposes. First, they supply first and second time-varying outputs to the coils 21 and 45 through their respective power leads 23 and 47. The a.c. power supplied to coil 21 is 90° out of phase with that supplied to coil 45 so that coils 21 and 45 produce a rotating magnetic field parallel to the planar arrays of chips 5 to control the movement of magnetic bubbles in each chip 5 in each array. Second, the components 41 serve to control bubble functions such as generation, annihilation, replication and transfer of bubble domains. The drive or field control signals supplied to the electronic components 41 from other circuits, are routed to package assembly 15 through tab connector 39. By locating the respective chip data sense and field drive/function control circuits components 63 and 41 on the separate boards 17 and 19, the noise interference between the high level drive and control signals and low level chip 5 data sense signals is reduced. Further, by making all the electronic components TTL compatible, ease of interface with external circuitry is also achieved. Finally, by placing the support electronics 41 and 63 and the receptacle sets 33 and 35 (which connect directly to the chips 5 on the module assembly boards 1 by means of the solder connections with terminal sets 11 and 13) on the printed wiring boards 17 and 19 respectively, fewer connections for interfacing the chips 5 are required than otherwise might be needed.

Chip 5 removal and replacement is readily accomplished because of the package assembly techniques employed. In order to gain access to any module assembly board 1, all that is required is removal of cover assembly 35, permanent magnet assembly 49, and coil 45 in that order. Then, by reheating the solder connections between terminal sets 11 and 13 and receptacle sets 33 and 35 respectively, the printed wiring boards 17 and 19 can be separated from the module assembly boards so that only coil 21 needs to be removed in order to expose the module assembly boards 1.

In view of the above, it will be seen that the several object of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A packaging assembly for magnetic bubble chips comprising:
    a plurality of parallel module assembly boards having a surface to which is secured in a substantially planar array a plurality of magnetic bubble chips for the storing and processing of information;
    first and second sets of terminals located on opposed lateral edges of each of said module assembly boards for the routing therethrough of electrical signals to and from said chips;
    first and second mounting boards positioned in spaced parallel registering relationship with each other, each board having respective sets of receptacle means for soldering thereto of a corresponding set of said terminals of each of said module assembly boards, said module assembly boards extending between said mounting boards in transverse relationship thereto and being secured to said mounting boards by soldered connections between the sets of terminals and receptacle means;
    coil means surrounding said plurality of module assembly boards and wound about an axis parallel to the planes of said chips on said module assembly boards for producing a magnetic field parallel thereto;
    bias field means positioned exterior to said coil means for producing a substantially constant magnetic field perpendicular to the planes of said chips on said module assembly boards;
    means for exciting said coil means to produce a rotating magnetic field parallel to the planes of said chips on said module assembly boards to control the movement of magnetic bubbles therein; and
    means for controlling the storage and processing of information in said chips whereby convenient access to the chips may be gained by sequential disassembly of said bias field means, said coil means, and reheating of the solder connections between the terminals and receptacle means for each respective module assembly board.

2. An assembly as set forth in claim 1, wherein said coil means comprises a first coil surrounding said module assembly boards and wound about an axis parallel to the planes of said chips, and a second coil surrounding said first coil and wound about an axis perpendicular to that of said first coil and parallel to the planes of said chips for producing a magnetic field parallel thereto.

3. An assembly as set forth in claim 1 wherein the first and second sets of terminals are connector pins for insertion into corresponding sets of receptacle means on the first and second mounting boards and the soldering thereto.

4. An assembly as set forth in claim 1 which further includes a spacer for insertion between said first and second mounting boards thereby to provide structural rigidity.

5. An assembly as set forth in claim 1 wherein the control means further includes electronic integrated circuit chips secured to a surface of the module assembly boards.

6. An assembly as set forth in claim 1 wherein said bias field means is a permanent magnet assembly for producing a substantially constant magnetic field perpendicular to the respective planar arrays of the chips on said module assembly boards comprising:
    first and second opposed planar permanent magnets, said magnets being positioned parallel to and generally in registry with each other and perpendicular to the respective planar arrays of said chips on said module assembly boards,
    first and second opposed plates of soft magnetic material, said plates being positioned parallel to and generally in registry with each other and parallel to the respective planar arrays of said chips on said module assembly boards, and
    said first and second permanent magnets and said first and second plates of soft magnetic material being secured to each other to form an open-ended rectangular box of magnetic material.

7. An assembly as set forth in claim 1 wherein said bias field means is a permanent magnet assembly and including first and second opposed planar permanent magnets, said magnets being positioned parallel to and generally in registry with each other for producing a substantially constant magnetic field perpendicular to the respective planar arrays of chips on said module assembly boards.

8. An assembly as set forth in claim 7 further including a cover for installation over said permanent magnet assembly, said cover being constructed of a shielding material for shunting stray magnetic fields thereby to maintain a predetermined magnetic environment around the magnetic bubble chips.

9. A packaging assembly for magnetic bubble chips comprising:
    at least one module assembly board having a surface to which is secured in a substantially planar array a plurality of magnetic bubble chips for the storing and processing of information;
    first and second sets of terminals located on opposed lateral edges of said module assembly board for the routing therethrough of electrical signals to and from said chips;
    first and second mounting boards, each board having a set of receptacle means for soldering thereto of a corresponding set of terminals, said first and second mounting boards being printed wiring boards on one of which is located the excitation means for said coil means and means for controlling the chips and on the other of which is located means for sensing data signals from the chips;
    coil means surrounding said module assembly board and wound about an axis parallel to the plane of said chips for producing a magnetic field parallel thereto;
    bias field means positioned exterior to said coil means for producing a substantially constant magnetic field perpendicular to the plane of said chips;

means for exciting said coil means to produce a rotating field parallel to the plane of said chips to control the movement of magnetic bubbles therein; and means for controlling the storage and processing of information in said chips whereby convenient access to the chips may be gained by sequential disassembly of said bias field means, said coil means, and reheating of the solder connection between the terminal and receptacle means.

10. An assembly as set forth in claim 9 wherein the first and second printed wiring boards include terminal means for interfacing said boards with other circuits.

11. An assembly as set forth in claim 9 wherein said first and second printed wiring boards have a first section on which the respective first and second receptacle means are mounted and a second section wider than said first section on one of which the respective excitation means and control means are mounted and on the other of which the means for sensing data signals are mounted.

* * * * *